(12) United States Patent
Park et al.

(10) Patent No.: US 9,406,383 B2
(45) Date of Patent: Aug. 2, 2016

(54) NON-VOLATILE MEMORY DEVICE AND METHOD OF PROGRAMMING THE SAME

(71) Applicant: SAMSUNG ELECTRONICS CO., LTD., Suwon-Si, Gyeonggi-Do (KR)

(72) Inventors: Il-Han Park, Suwon-Si (KR); Su-Yong Kim, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/606,284

(22) Filed: Jan. 27, 2015

(65) Prior Publication Data

US 2015/0348630 A1 Dec. 3, 2015

(30) Foreign Application Priority Data

Jun. 2, 2014 (KR) .................. 10-2014-0066677

(51) Int. Cl.
| | | |
|---|---|---|
| G11C 7/10 | (2006.01) | |
| G11C 16/08 | (2006.01) | |
| G11C 11/56 | (2006.01) | |
| G11C 16/12 | (2006.01) | |

(52) U.S. Cl.
CPC ............ G11C 16/08 (2013.01); G11C 11/5628 (2013.01); G11C 16/12 (2013.01)

(58) Field of Classification Search
USPC ................................. 365/185.18, 189, 14, 15
See application file for complete search history.

(56) References Cited

U.S. PATENT DOCUMENTS

| | | | |
|---|---|---|---|
| 7,184,308 B2 | 2/2007 | Kwon et al. | |
| 8,077,524 B2 | 12/2011 | Lutze et al. | |
| 8,238,161 B2 | 8/2012 | Park et al. | |
| 8,274,931 B2 | 9/2012 | Pajukoski et al. | |
| 8,363,471 B2 | 1/2013 | Ryu | |
| 8,406,063 B2 | 3/2013 | Mokhlesi et al. | |
| 8,411,503 B2 | 4/2013 | Lee | |
| 8,520,441 B2 | 8/2013 | Yuh | |
| 2003/0048662 A1* | 3/2003 | Park ...................... | G11C 16/12 365/185.18 |
| 2006/0250850 A1* | 11/2006 | Lee ..................... | G11C 16/3427 365/185.18 |
| 2011/0063917 A1* | 3/2011 | Shiino ................ | G11C 11/5635 365/185.17 |
| 2011/0063919 A1* | 3/2011 | Chandrasekhar .. | G11C 16/3427 365/185.19 |
| 2011/0199828 A1 | 8/2011 | Kim et al. | |
| 2013/0100747 A1 | 4/2013 | Leem | |

FOREIGN PATENT DOCUMENTS

JP 2013191264 A 9/2013

* cited by examiner

*Primary Examiner* — Huan Hoang
*Assistant Examiner* — Minh Dinh
(74) *Attorney, Agent, or Firm* — Volentine & Whitt, PLLC

(57) ABSTRACT

A non-volatile memory device includes a first word line, a second word line, first memory cells, second memory cells, and an address decoder. The second word line is adjacent to the first word line. The first memory cells are connected to the first word line. The second memory cells are connected to the second word line. The second memory cells are connected to the first memory cells, respectively. The address decoder applies a first voltage to the first word line and applies a second voltage to the second word line in an over program period of the first memory cells. The first voltage is higher than a program voltage of the first and second memory cells. The second voltage is lower than a pass voltage of the first and second memory cells.

20 Claims, 12 Drawing Sheets

NON-VOLATILE MEMORY DEVICE AND METHOD OF PROGRAMMING THE SAME

CROSS-REFERENCE TO RELATED APPLICATION

This U.S. Non-provisional application claims priority under 35 USC §119 to Korean Patent Application No. 10-2014-0066677, filed on Jun. 2, 2014, in the Korean Intellectual Property Office (KIPO), the disclosure of which is incorporated by reference in its entirety herein.

BACKGROUND

1. Technical Field

Example embodiments relate generally to non-volatile memory devices and more particularly to non-volatile memory devices with enhanced program accuracy and a method of programming non-volatile memory devices more accurately.

2. Discussion of the Related Art

Semiconductor memory devices are classified into volatile memory devices and non-volatile memory devices. The volatile memory device loses stored data when supply voltage is not delivered. The non-volatile memory device keeps stored data when supply voltage is not delivered. The non-volatile memory device includes a flash memory device which may erase data and program data electrically.

Operations of the non-volatile memory device are classified into a program mode, a read modem, and an erase mode. A user may write data to memory cells included in the non-volatile memory device in the program mode. A user may read data from the memory cells in the read mode. A user may erase the stored data of the memory cells in the erase mode.

In general, the non-volatile memory device stores data to the memory cells by changing a threshold voltage of the memory cells. A memory cell included in the non-volatile memory device may have a first threshold voltage distribution representing an erased status or a second threshold voltage distribution representing a programmed status. Therefore, the non-volatile memory device may read stored data of the memory cell based on threshold voltage distribution of the memory cells.

As size of the memory cell array included in the non-volatile memory device increase, a difference between a threshold voltage of a first memory cell, which is closer to an address decoder, and a threshold voltage of a second memory cell, which is farther from the address decoder, increases during program operation.

SUMMARY

At least one example embodiment of the inventive concept provides a non-volatile memory device with enhanced program accuracy.

At least one example embodiment of the inventive concept provides a method of programming a non-volatile memory device more accurately.

According to example embodiments, a non-volatile memory device includes a first word line, a second word line, first memory cells, second memory cells, and an address decoder. The second word line is adjacent to the first word line. The first memory cells are connected to the first word line. The second memory cells are connected to the second word line. The second memory cells are connected to the first memory cells, respectively. The address decoder applies a first voltage to the first word line and applies a second voltage to the second word line in an over program period of the first memory cells. The first voltage is higher than a program voltage of the first and second memory cells. The second voltage is lower than a pass voltage of the first and second memory cells.

In an example embodiment, the address decoder may apply the program voltage to the first word line and apply the pass voltage to the second word line in a normal program period of the first memory cells. The normal program period may be performed after the over program period.

In an example embodiment, the non-volatile memory device may further include a third word line which is not adjacent to the first word line, and third memory cells connected to the third word line. In an example embodiment, the address decoder may apply the second voltage to the third word line in the over program period. In an example embodiment, the address decoder may apply the pass voltage to the third word line in the over program period.

In an example embodiment, a memory cell of the first memory cells may include a first floating gate transistor having a first floating gate and a first control gate connected to the first word line. A memory cell of the second memory cells may include a second floating gate transistor having a second floating gate and a second control gate connected to the second word line. The memory cell of the first memory cells may be connected to the memory cell of the second memory cells.

In an example embodiment, a voltage difference between the first floating gate and a substrate may be generated based on a voltage of the first control gate and a voltage of the second control gate. In an example embodiment, the second floating gate transistor may operate as a pass transistor in the over program period. In an example embodiment, the first floating gate transistor may store charge corresponding to a voltage difference between the first floating gate and a substrate to the first floating gate in the over program period.

In an example embodiment, a voltage difference between the first floating gate and a substrate in the over program period may be equal to or lower than the voltage difference between the first floating gate and the substrate when the program voltage is applied to the first word line and the pass voltage is applied to the second word line.

In an example embodiment, a source of the first floating gate transistor may be connected to a drain of the second floating gate transistor. In an example embodiment, a drain of the first floating gate transistor may be connected to a source of the second floating gate transistor.

In an example embodiment, the first memory cells may include a near floating gate transistor and a far floating gate transistor. The near floating gate transistor may include a first floating gate and a first control gate connected to the first word line. The near floating gate transistor may be disposed within a first distance from the address decoder. The far floating gate transistor may include a second floating gate and a second control gate connected to the first word line. The far floating gate transistor may be disposed outside the first distance from the address decoder.

In an example embodiment, a voltage difference between the first floating gate and a substrate in the over program period may be equal to or lower than the voltage difference between the first floating gate and the substrate when the program voltage is applied to the first word line and the pass voltage is applied to the second word line. In an example embodiment, a voltage difference between the second floating gate and a substrate in the over program period may be equal to or lower than the voltage difference between the first floating gate and the substrate when the program voltage is applied to the first word line and the pass voltage is applied to the second word line.

In an example embodiment, the non-volatile memory device may further include a control circuit configured to generate a row address signal and a column address signal based on a command signal and an address signal.

In an example embodiment, the non-volatile memory device may further include a voltage generating circuit and a data input/output circuit. The voltage generating circuit may generate the program voltage, the pass voltage, the first voltage, and the second voltage. The data input/output circuit may be connected to the first and second memory cells through a plurality of bit lines in response to the column address signal.

In an example embodiment, the address decoder may operate in response to the row address signal. The first word line may correspond to the row address signal.

According to example embodiments, a non-volatile memory device includes a first word line, a second word line, first memory cells, second memory cells, a control circuit, a data input/output circuit, a voltage generating circuit, and an address decoder. The second word line is adjacent to the first word line. The first memory cells are connected to the first word line. The second memory cells are connected to the second word line. The second memory cells are connected to the first memory cells, respectively. The control circuit generates a row address signal and a column address signal based on a command signal and an address signal. The data input/output circuit is connected to the first and second memory cells through a plurality of bit lines in response to the column address signal. The voltage generating circuit generates a program voltage of the first and second memory cells, a pass voltage of the first and second memory cells, a first voltage, and a second voltage. The first voltage is higher than the program voltage. The second voltage is lower than the pass voltage. The address decoder applies the first voltage to the first word line corresponding to the row address signal and applies the second voltage to the second word line in an over program period of the first memory cells.

According to example embodiments, a method of programming a non-volatile memory device which includes a first word line, a second word line adjacent to the first word line, first memory cells connected to the first word line, second memory cells, which are connected to the second word line and are connected to the first memory cells respectively, and an address decoder, includes: applying, by the address decoder, a first voltage to the first word line and a second voltage to the second word line in an over program period of the first memory cells; and applying, by the address decoder, a program voltage to the first word line and a pass voltage to the second word line in a normal program period of the first memory cells. The first voltage is higher than the program voltage of the first and second memory cells. The second voltage is lower than the pass voltage of the first and second memory cells. The normal program period is disposed after the over program period.

As described above, the non-volatile memory device and the method of programming the non-volatile memory device may reduce a difference between the program time of a near memory cell which is near the address decoder and the program time of a far memory cell which is far from the address decoder and prevent over program of the near memory cell by applying a high voltage which is higher than the program voltage to a first word line corresponding to address signal and applying a low voltage which is lower than the pass voltage to a second word line which is adjacent to the first word line during program operation. After completing the program operation, a difference between a threshold voltage of the near memory cell and a threshold voltage of the far memory cell according to example embodiments may be lower than difference between the threshold voltage of the near memory cell and the threshold voltage of the far memory cell according to a conventional approach.

BRIEF DESCRIPTION OF THE DRAWINGS

Example embodiments of the inventive concept will be more clearly understood from the following detailed description taken in conjunction with the accompanying drawings.

DETAILED DESCRIPTION OF THE EMBODIMENTS

Figure 1:
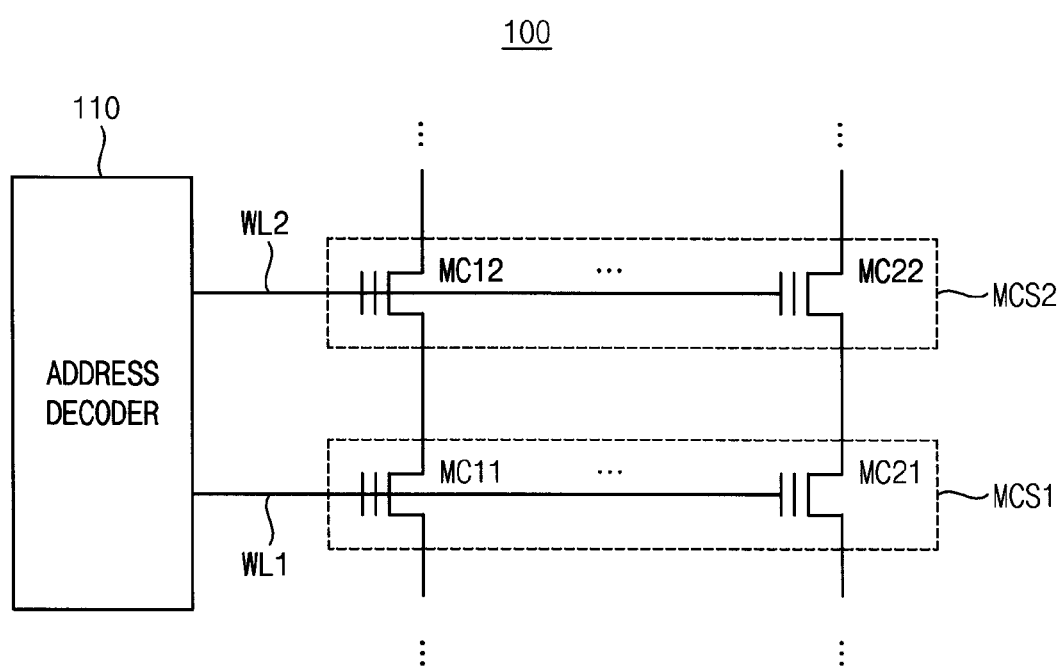
FIGS. 1 and 2 are block diagrams illustrating non-volatile memory devices according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
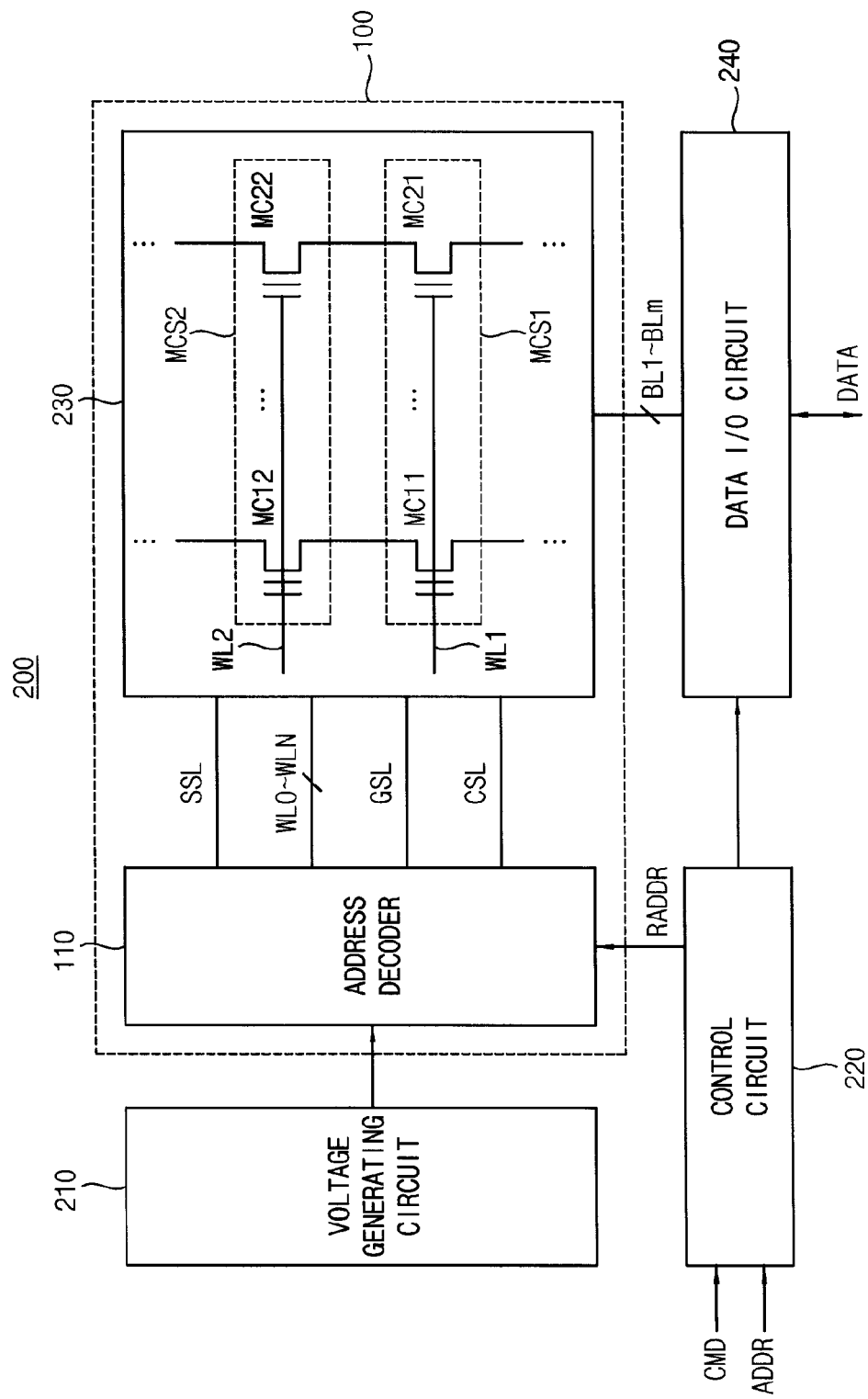

FIGS. 1 and 2 are block diagrams illustrating non-volatile memory devices according to example embodiments. Referring to FIG. 1, a non-volatile memory device 100 includes a first word line WL1, a second word line WL2, first memory cells MCS1, second memory cells MCS2, and an address decoder ADDRESS DECODER 110. The first memory cells MCS1 include a (1, 1) memory cell MC11 and a (2, 1) memory cell MC21. The second memory cells MCS2 include a (1, 2) memory cell MC12 and a (2, 2) memory cell MC22.

The second word line WL2 is adjacent to the first word line WL1. The first memory cells MCS1 are connected to the first word line WL1. A control gate of the (1, 1) memory cell MC11 is connected to the first word line WL1. A control gate of the (2, 1) memory cell MC21 is connected to the first word line WL1. The second memory cells MCS2 are connected to the second word line WL2. A control gate of the (1, 2) memory cell MC12 is connected to the second word line WL2. A control gate of the (2, 2) memory cell MCS22 is connected to the second word line WL2.

The second memory cells MCS2 are connected to the first memory cells MCS1, respectively. Each of the (1, 1) memory cell MC11, the (1, 2) memory cell MC12, the (2, 1) memory cell MC21, and the (2, 2) memory cell MC22 may be implemented with a floating gate transistor.

In an example embodiment, the source of the (1, 1) memory cell MC11 may be connected to the drain of the (1, 2) memory cell MC12. The source of the (2, 1) memory cell MC21 may be connected to the drain of the (2, 2) memory cell MC22. In another example embodiment, the drain of the (1, 1) memory cell MC11 may be connected to the source of the (1, 2) memory cell MC12. The drain of the (2, 1) memory cell MC21 may be connected to the source of the (2, 2) memory cell MC22. Thus, in an example embodiment, a drain of the first floating gate transistor may be connected to a source of the second floating gate transistor.

The first memory cells MCS1 and the first word line WL1 may represent a block included in the memory cell array 230.

The second memory cells MCS2 and the second word line WL2 may represent another block included in the memory cell array 230.

The address decoder 110 may apply a first voltage to the first word line WL1 in an over program period of the first memory cells MCS1. The first voltage may be higher than a program voltage of the first and second memory cells MCS1, MCS2. The address decoder 110 may apply a second voltage to the second word line WL2 in an over program period of the first memory cells MCS1. The second voltage may be lower than a pass voltage of the first and second memory cells MCS1, MCS2. The address decoder 110 may apply the program voltage to the first word line WL1 and apply the pass voltage to the second word line WL2 in a normal program period of the first memory cells MCS1. The normal program period may be performed after the over program period.

The non-volatile memory device 100 according to an example embodiment may reduce a difference between the program time of a near memory cell which is near the address decoder 110 and program time of a far memory cell which is far from the address decoder 110 and prevent over program of the near memory cell by applying a high voltage which is higher than the program voltage to the first word line WL1, and applying a low voltage which is lower than the pass voltage to the second word line WL2 during the program operation. After completing the program operation, a difference between a threshold voltage of the near memory cell and a threshold voltage of the far memory cell according to example embodiments may be lower than a difference between the threshold voltage of the near memory cell and the threshold voltage of the far memory cell according to conventional approaches.

The over program period of the first memory cells MCS1 and normal program period of the first memory cells MCS1 will be described below with the reference to FIG. 8.

Referring to FIG. 2, a non-volatile memory device 200 includes word lines WL0, WL1, WL2 through WLN), a string selection line SSL, a ground selection line GSL, a common source line CSL, a first memory cells MCS1, a second memory cells MCS2, a control circuit CONTROL CIRCUIT 220, a data input/output circuit DATA I/O CIRCUIT 240, a voltage generating circuit VOLTAGE GENERATING CIRCUIT 210, and an address decoder ADDRESS DECODER. The non-volatile memory device 200 may include a third word line other than the first word lines WL1 and the second word line WL2. The non-volatile memory device 200 may include a third memory cells connected to the third word line other than the first memory cells MCS1 and the second memory cells MCS2.

The first word line WL1, the second word line WL2, the first memory cells MCS1, the second memory cells MCS2, and the address decoder ADDRESS DECODER may be understood based on the reference to FIG. 1. The second word line WL2 is adjacent to the first word line WL1. The first memory cells MCS1 are connected to the first word line WL1. A control gate of the (1, 1) memory cell MC11 is connected to the first word line WL1. A control gate of the (2, 1) memory cell MC21 is connected to the first word line WL1. The second memory cells MCS2 are connected to the second word line WL2. A control gate of the (1, 2) memory cell MC12 is connected to the second word line WL2. A control gate of the (2, 2) memory cell MC22 is connected to the second word line WL2.

The second memory cells MCS2 are connected to the first memory cells MCS1, respectively. Each of the (1, 1) memory cell MC11, the (1, 2) memory cell MC12, the (2, 1) memory cell MC21, and the (2, 2) memory cell MC22 may be implemented with a floating gate transistor. In an example embodiment, the source of the (1, 1) memory cell MC11 may be connected to the drain of the (1, 2) memory cell MC12. The source of the (2, 1) memory cell MC21 may be connected to the drain of the (2, 2) memory cell MC22.

In another example embodiment, the drain of the (1, 1) memory cell MC11 may be connected to the source of the (1, 2) memory cell MC12. The drain of the (2, 1) memory cell MC21 may be connected to the source of the (2, 2) memory cell MC22.

The first memory cells MCS1 and the first word line WL1 may represent a block included in the memory cell array 230. The second memory cells MCS2 and the second word line WL2 may represent another block included in the memory cell array 230.

The memory cell array 230 may be implemented with a two dimensional structure or three dimensional structure on the substrate. For example, the memory cells included in the memory cell array 230 may be implemented in a perpendicular direction to the substrate or a parallel direction to the substrate.

In an example embodiment, each of the first memory cells MCS1 and the second memory cells MCS2 included the memory cell array 230 may be a single level cell SLC storing 1 bit data. In an example embodiment, each of the first memory cells MCS1 and the second memory cells MCS2 included in the memory cell array 230 may be a multi level cell MLC storing multiple bits data.

The control circuit 220 controls operations of the non-volatile memory device 200 by controlling the voltage generating circuit 210, the address decoder 110, and the data input/output circuit 240 based on a command signal CMD and an address signal ADDR which are received from the external device such as a memory controller. For example, the control circuit 220 may execute a program operation, read operation, and an erase operation of the non-volatile memory device 200 based on the command signal CMD and the address signal ADDR.

In an example embodiment, the control circuit 220 may generate a row address signal RADDR and a column address signal CADDR based on a command signal CMD and an address signal ADDR. The control circuit 220 may provide the row address signal RADDR to the address decoder 110. The control circuit 220 may provide the column address signal CADDR to the data input/output circuit 240.

The voltage generating circuit 210 may generate various voltages to operate the non-volatile memory device 200. For example, the voltage generating circuit 210 may generate a program voltage, pass voltage, and a program verification voltage used for program operation. The voltage generating circuit 210 may generate a read voltage used for read operation. The voltage generating circuit 210 may generate an erase voltage used for erase operation. The voltage generating circuit 210 may generate the first voltage which is higher than the program voltage of the first and second memory cells MCS1, MCS2. The voltage generating circuit 210 may generate the second voltage which is lower than the pass voltage of the first and second memory cells MCS1, MCS2.

The address decoder 110 is connected to the memory cell array 230 through a plurality of word lines WL0 through WLN, a string selection signal SSL, and a ground selection signal GSL. The address decoder 110 may select one of the plurality of the word lines WL0 through WLN based on the row address signal RADDR received from the control circuit 220. The address decoder 110 may provide various voltages, which are received from the voltage generating circuit 210, to the selected word line or the word lines which are not selected. The address decoder 110 may apply the first voltage to the first word line WL1 corresponding to the row address signal RADDR in the over program period of the first memory cells MCS1. The address decoder 110 may apply the second voltage to the second word line WL2 in the over program period of the first memory cells MCS1. The address decoder 110 may apply the program voltage to the first word line WL1 in the normal program period of the first memory cells MCS1. The address decoder 110 may apply the pass voltage to the second word line WL2 in the normal program period of the first memory cells MCS1.

The over program period of the first memory cells MCS1 and the normal program period of the first memory cells MCS1 will be described below with the reference to FIG. 8.

The data input/output circuit 240 is connected to the memory cell array 230 through a plurality of bit lines BL1 through BLm. The data input/output circuit 240 may select one of the plurality of the bit lines BL1 through BLm based on the column address signal CADDR received from the control circuit 220. The data input/output circuit 240 may output data DATA which is read from a memory cell connected to the selected bit line to the external device. The data input/output circuit 240 may write data DATA which is received from the external device to a memory cell connected to the selected bit line. In an example embodiment, the data input/output circuit 240 may include a sense amplifier, a pager buffer, a column selection circuit, a writing driving, and a data buffer.

The non-volatile memory device 200 according to an example embodiment may reduce a difference between program time of a near memory cell which is near the address decoder 110 and the program time of a far memory cell which is far from the address decoder 110 and prevent over program of the near memory cell by applying a high voltage which is higher than program voltage to the first word line WL1 and applying a low voltage which is lower than pass voltage to the second word line WL2 during program operation. After completing the program operation, a difference between a threshold voltage of the near memory cell and a threshold voltage of the far memory cell according to example embodiments may be lower than a difference between the threshold voltage of the near memory cell and the threshold voltage of the far memory cell according to conventional methods.

Figure 3:
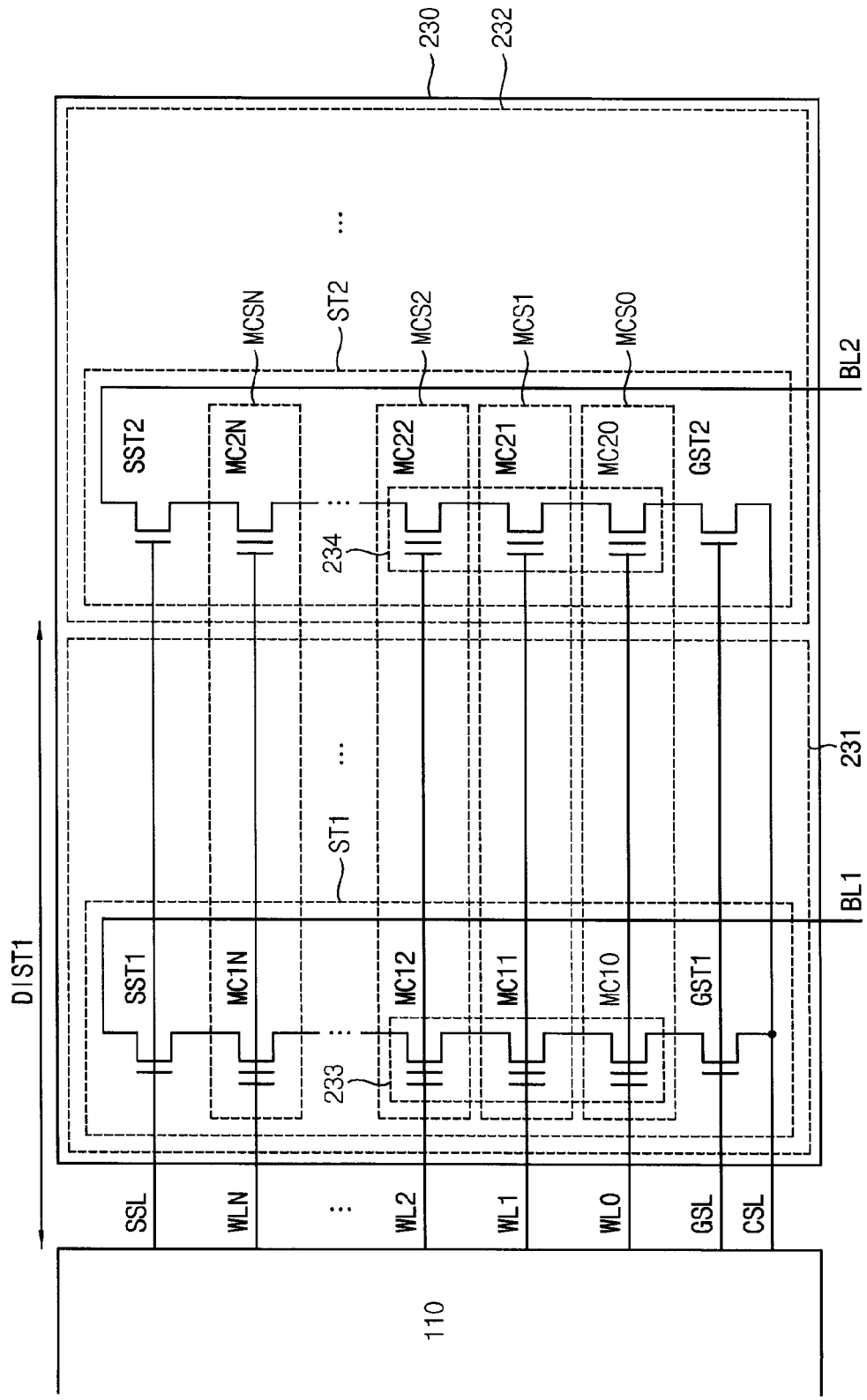
FIG. 3 is a circuit diagram illustrating a memory cell array included in the non-volatile memory device of FIG. 2.

FIG. 3 is a circuit diagram illustrating a memory cell array included in the non-volatile memory device of FIG. 2. Referring to FIG. 3, the memory cell array 230 may include near cell strings 231 and far cell strings 232. The near cell strings 231 indicates cell strings disposed within a first distance DIST1 from the address decoder 110. The far cell strings 232 indicates cell strings disposed outside the first distance DIST1 from the address decoder 110. Each of the floating gate transistors MC10, MC11, MC12, MC1N included in the first cell string ST1 may be classified as a near floating gate transistor. Each of the floating gate transistors MC20, MC21, MC22, and MC2N included in the second cell string ST2 may be classified as a far floating gate transistor.

The first cell string ST1 may be connected between the first bit line BL1 and the common source line CSL. The second cell string ST2 may be connected between the second bit line BL2 and the common source line CSL. The first cell string ST1 may include a first string selection transistor SST1, a (1, 1) floating gate transistor MC11, a (1, 2) floating gate transistor MC12, a (1, 3) floating gate transistor MC10, a (1, 4) floating gate transistor MC1N, and a first ground selection transistor GST1. A gate of the first string selection transistor SST1 may be connected to the string selection line SSL. A gate of the first ground selection transistor GST1 may be connected to the ground selection line GSL.

The second cell string ST2 may include a second string selection transistor SST2, a (2, 1) floating gate transistor MC21, a (2, 2) floating gate transistor MC22, a (2, 3) floating gate transistor MC20, a (2, 4) floating gate transistor MC2N, and a second ground selection transistor GST2. A gate of the second string selection transistor SST2 may be connected to the string selection line SSL. A gate of the second ground selection transistor GST2 may be connected to the ground selection line GSL.

The first memory cells MCS1 and the first word line WL1 may represent a block included in the memory cell array 230. The second memory cells MCS2 and the second word line WL2 may represent another block included in the memory cell array 230. The third memory cells MCS0 and the third word line WL0 may represent still another block included in the memory cell array 230. The fourth memory cells MCSN and the fourth word line WLN may represent still another block included in the memory cell array 230.

The first memory cells MCS1 may include the (1, 1) floating gate transistor MC11 as the (1, 1) memory cell. The first memory cells MCS1 may include the (2, 1) floating gate transistor MC21 as the (2, 1) memory cell. The second memory cells MCS2 may include the (1, 2) floating gate transistor MC12 as the (1, 2) memory cell. The second memory cells MCS2 may include the (2, 2) floating gate transistor MC22 as the (2, 2) memory cell. The third memory cells MCS0 may include the (1, 3) floating gate transistor MC10 as the (1, 3) memory cell. The third memory cells MCS0 may include the (2, 3) floating gate transistor MC20 as the (2, 3) memory cell. The fourth memory cells MCSN may include the (1, 4) floating gate transistor MC1N as the (1, 4) memory cell. The fourth memory cells MCSN may include the (2, 4) floating gate transistor MC2N as the (2, 4) memory cell.

The first word line WL1 may be connected to a control gate of the (1, 1) floating gate transistor MC11 and a control gate of the (2, 1) floating gate transistor MC21. The second word line WL2 may be connected to a control gate of the (1, 2) floating gate transistor MC12 and a control gate of the (2, 2) floating gate transistor MC22. The third word line WL0 may be connected to a control gate of the (1, 3) floating gate transistor MC10 and a control gate of the (2, 3) floating gate transistor MC20. The fourth word line WLN may be connected to a control gate of the (1, 4) floating gate transistor MC1N and a control gate of the (2, 4) floating gate transistor MC2N.

The first word line WL1 is adjacent to the second word line WL2 and the third word line WL0. The first word line WL1 is not adjacent to the fourth word line WLN. A source of the (1, 1) floating gate transistor MC11 may be connected to a drain of the (1, 3) floating gate transistor MC10. A drain of the (1, 1) floating gate transistor MC11 may be connected to a source of the (1, 2) floating gate transistor MC12. A source of the (2, 1) floating gate transistor MC21 may be connected to a drain of the (2, 3) floating gate transistor MC20. A drain of the (2, 1) floating gate transistor MC21 may be connected to a source of the (2, 2) floating gate transistor MC22.

Figure 4:
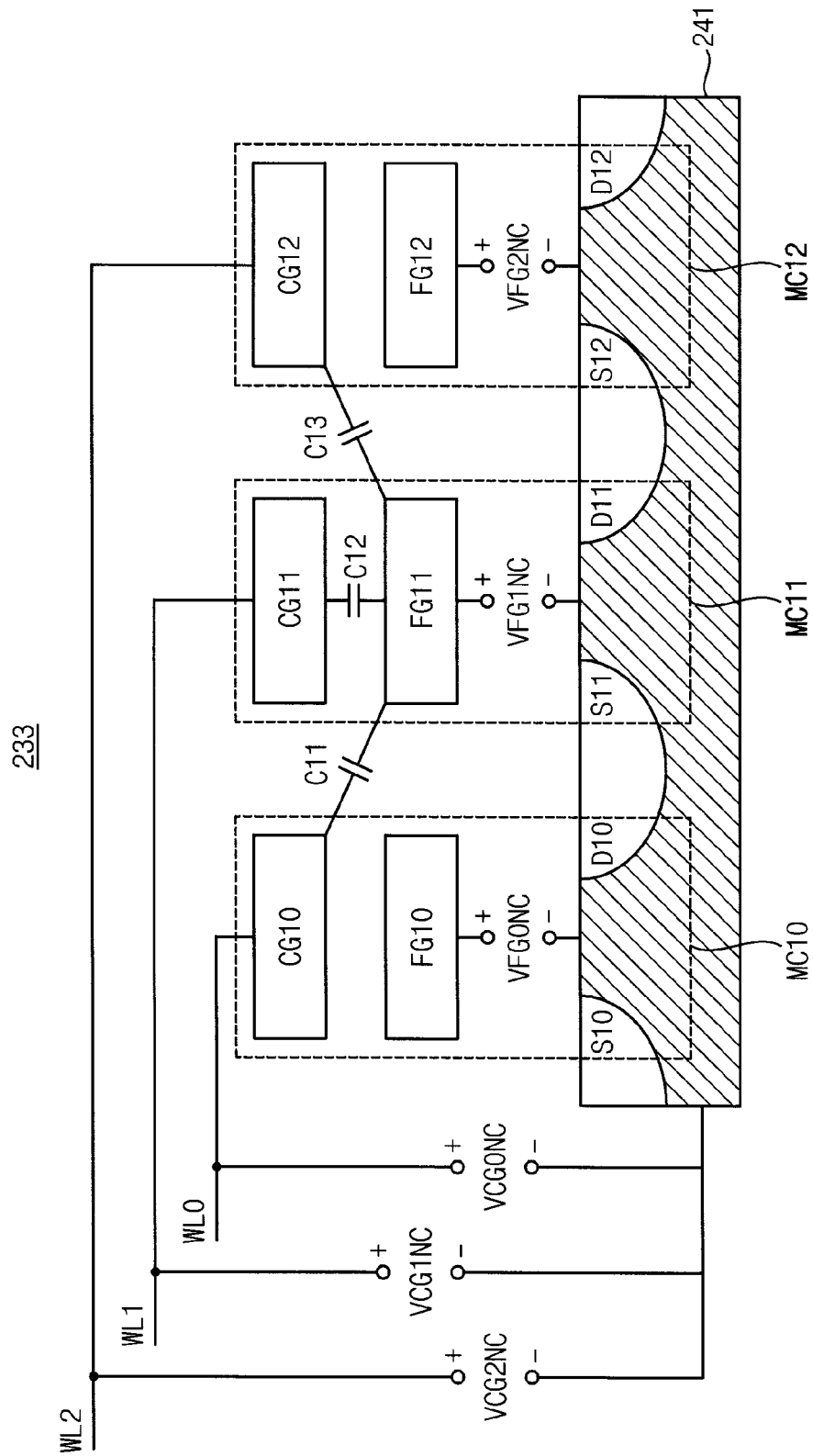
FIGS. 4 and 5 are sectional views of memory cells included in the memory cell array of FIG. 3.
Figure 5:
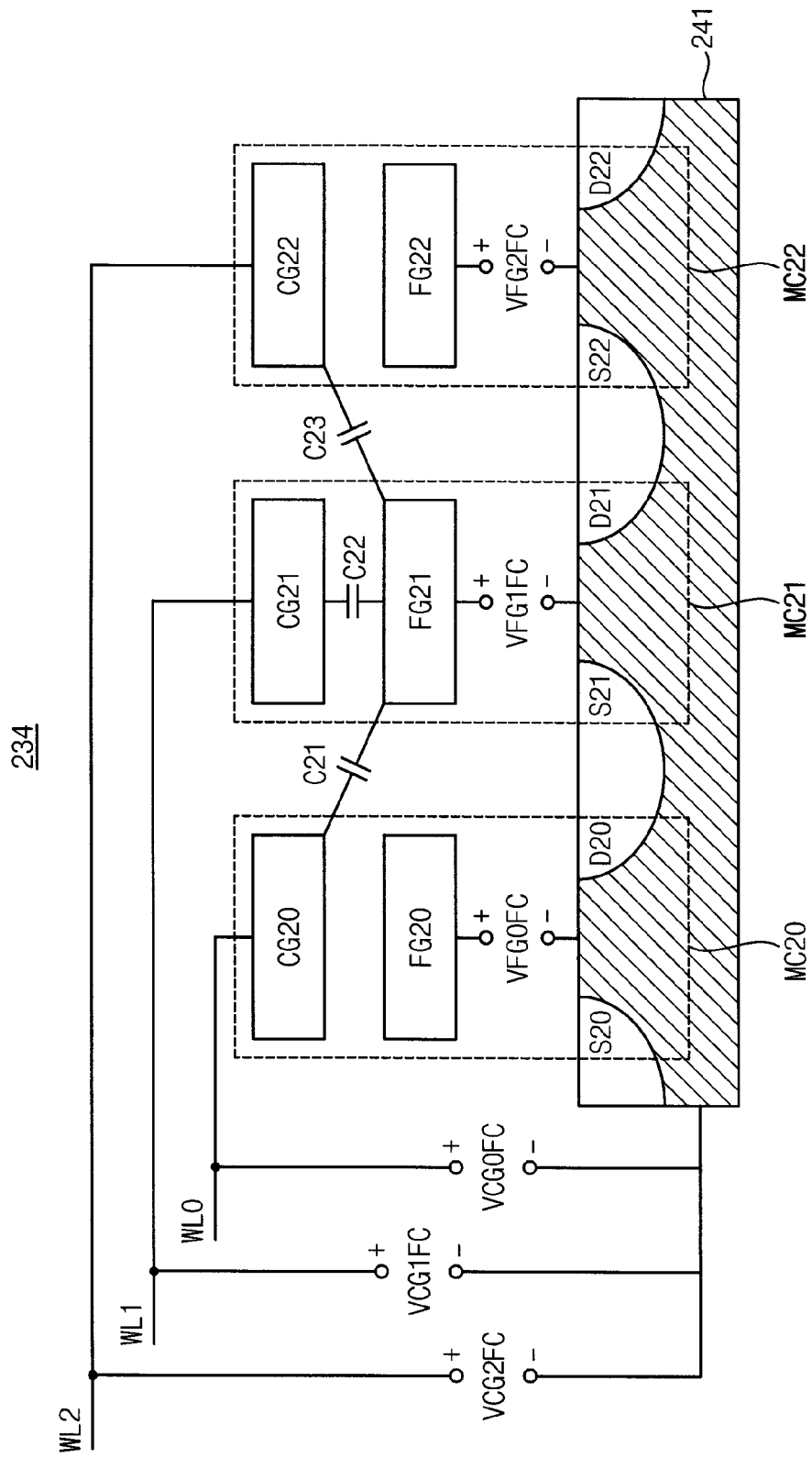

The first column floating gate transistors MC10, MC11, MC12 will be described with the reference to FIG. 4. The second column floating gate transistors MC20, MC21, MC22 will be described with the reference to FIG. 5. FIGS. 4 and 5 are sectional views of memory cells included in the memory cell array of FIG. 3.

Referring to FIG. 4, the first column floating gate transistors 233 includes a (1, 1) floating gate transistor MC11, a (1, 2) floating gate transistor MC12, and a (1, 3) floating gate transistor MC10. The (1, 1) floating gate transistor MC11 includes a (1, 1) control gate CG11 and a (1, 1) floating gate FG11. The first word line WL1 may be connected to the (1, 1) control gate CG11. An insulator may be disposed between the (1, 1) control gate CG11 and the (1, 1) floating gate FG11. Another insulator may be disposed between (1, 1) floating gate FG11 and the substrate 241. The (1, 2) floating gate transistor MC12 includes a (1, 2) control gate CG12 and a (1, 2) floating gate FG12. The second word line WL2 may be connected to the (1, 2) control gate CG12. An insulator may be disposed between the (1, 2) control gate CG12 and the (1, 2) floating gate FG12. Another insulator may be disposed between (1, 2) floating gate FG12 and the substrate 241. The (1, 3) floating gate transistor MC10 includes a (1, 3) control gate CG10 and a (1, 3) floating gate FG10. The third word line WL0 may be connected to the (1, 3) control gate CG10. An insulator may be disposed between the (1, 3) control gate CG10 and the (1, 3) floating gate FG10. Another insulator may be disposed between (1, 3) floating gate FG10 and the substrate 241. The drain D10 of the (1, 3) floating gate transistor MC10 may be connected to the source S11 of the (1, 1) floating gate transistor MC11. The drain D11 of the (1, 1) floating gate transistor MC11 may be connected to the source S12 of the (1, 2) floating gate transistor MC12.

The first parasitic capacitance C11 may exist between the (1, 1) floating gate FG11 and the (1, 3) control gate CG10. The second parasitic capacitance C12 may exist between the (1, 1) floating gate FG11 and the (1, 1) control gate CG11. The third parasitic capacitance C13 may exist between the (1, 1) floating gate FG11 and the (1, 2) control gate CG12. Voltage difference VFG1NC between the (1, 1) floating gate FG11 and the substrate 241 may be generated based on voltage VCG1NC of the (1, 1) control gate CG11, voltage VCG2NC of the (1, 2) control gate CG12, and voltage VCG0NC of the (1, 3) control gate CG10. Voltage difference VFG2NC between the (1, 2) floating gate FG12 and the substrate 241 and voltage difference VFG0NC between the (1, 3) floating gate FG10 and the substrate 241 may be understood based on the voltage difference VFG1NC between the (1, 1) floating gate FG11 and the substrate 241.

Signals of the first column floating gate transistors 233 will be described below with the references to FIGS. 6 through 8.

Referring to FIG. 5, the second column floating gate transistors 234 includes a (2, 1) floating gate transistor MC21, a (2, 2) floating gate transistor MC22, and a (2, 3) floating gate transistor MC20. The (2, 1) floating gate transistor MC21 includes a (2, 1) control gate CG21 and a (2, 1) floating gate FG21. The first word line WL1 may be connected to the (2, 1) control gate CG21. An insulator may be disposed between the (2, 1) control gate CG21 and the (2, 1) floating gate FG21. Another insulator may be disposed between (2, 1) floating gate FG21 and the substrate 241. The (2, 2) floating gate transistor MC22 includes a (2, 2) control gate CG22 and a (2, 2) floating gate FG22. The second word line WL2 may be connected to the (2, 2) control gate CG22. An insulator may be disposed between the (2, 2) control gate CG22 and the (2, 2) floating gate FG22. Another insulator may be disposed between (2, 2) floating gate FG22 and the substrate 241. The (2, 3) floating gate transistor MC20 includes a (2, 3) control gate CG20 and a (2, 3) floating gate FG20. The third word line WL0 may be connected to the (2, 3) control gate CG20. An insulator may be disposed between the (2, 3) control gate CG20 and the (2, 3) floating gate FG20. Another insulator may be disposed between (2, 3) floating gate FG20 and the substrate 241. The drain D20 of the (2, 3) floating gate transistor MC20 may be connected to the source S21 of the (2, 1) floating gate transistor MC21. The drain D21 of the (2, 1)

floating gate transistor MC21 may be connected to the source S22 of the (2, 2) floating gate transistor MC22.

The first parasitic capacitance C21 may exist between the (2, 1) floating gate FG21 and the (2, 3) control gate CG20. The second parasitic capacitance C22 may exist between the (2, 1) floating gate FG21 and the (2, 1) control gate CG21. The third parasitic capacitance C23 may exist between the (2, 1) floating gate FG21 and the (2, 2) control gate CG22. A voltage difference VFG1FC between the (2, 1) floating gate FG21 and the substrate 241 may be generated based on voltage VCG1FC of the (2, 1) control gate CG21, voltage VCG2FC of the (2, 2) control gate CG22, and voltage VCG0FC of the (2, 3) control gate CG20. A voltage difference VFG2FC between the (2, 2) floating gate FG22 and the substrate 241 and voltage difference VFG0FC between the (2, 3) floating gate FG20 and the substrate 241 may be understood based on the voltage difference VFG1FC between the (2, 1) floating gate FG21 and the substrate 241.

Signals of the second column floating gate transistors 234 will be described with the references to FIGS. 6 through 8. FIGS. 6 through 8 are timing diagrams illustrating operation of memory cells included in the FIGS. 4 through 5. For convenience, the voltage difference VFG1NC between the (1, 1) floating gate FG11 and the substrate 241 will be referred to as the voltage VFG1NC of the (1, 1) floating gate FG11. The voltage difference VFG2NC between the (1, 2) floating gate FG12 and the substrate 241 will be referred to as the voltage VFG2NC of the (1, 2) floating gate FG12. The voltage difference VFG0NC between the (1, 3) floating gate FG10 and the substrate 241 will be referred to as the voltage VFG0NC of the (1, 3) floating gate FG10. The voltage difference VFG1FC between the (2, 1) floating gate FG21 and the substrate 241 will be referred to as the voltage VFG1FC of the (2, 1) floating gate FG21. The voltage difference VFG2FC between the (2, 2) floating gate FG22 and the substrate 241 will be referred to as the voltage VFG2FC of the (2, 2) floating gate FG22. The voltage difference VFG0FC between the (2, 3) floating gate FG20 and the substrate 241 will be referred to as the voltage VFG0FC of the (2, 3) floating gate FG20. FIGS. 6 and 7 describe an operation of signals according to the conventional method. FIG. 8 describes an operation of signals according to an example embodiment.

Figure 6:
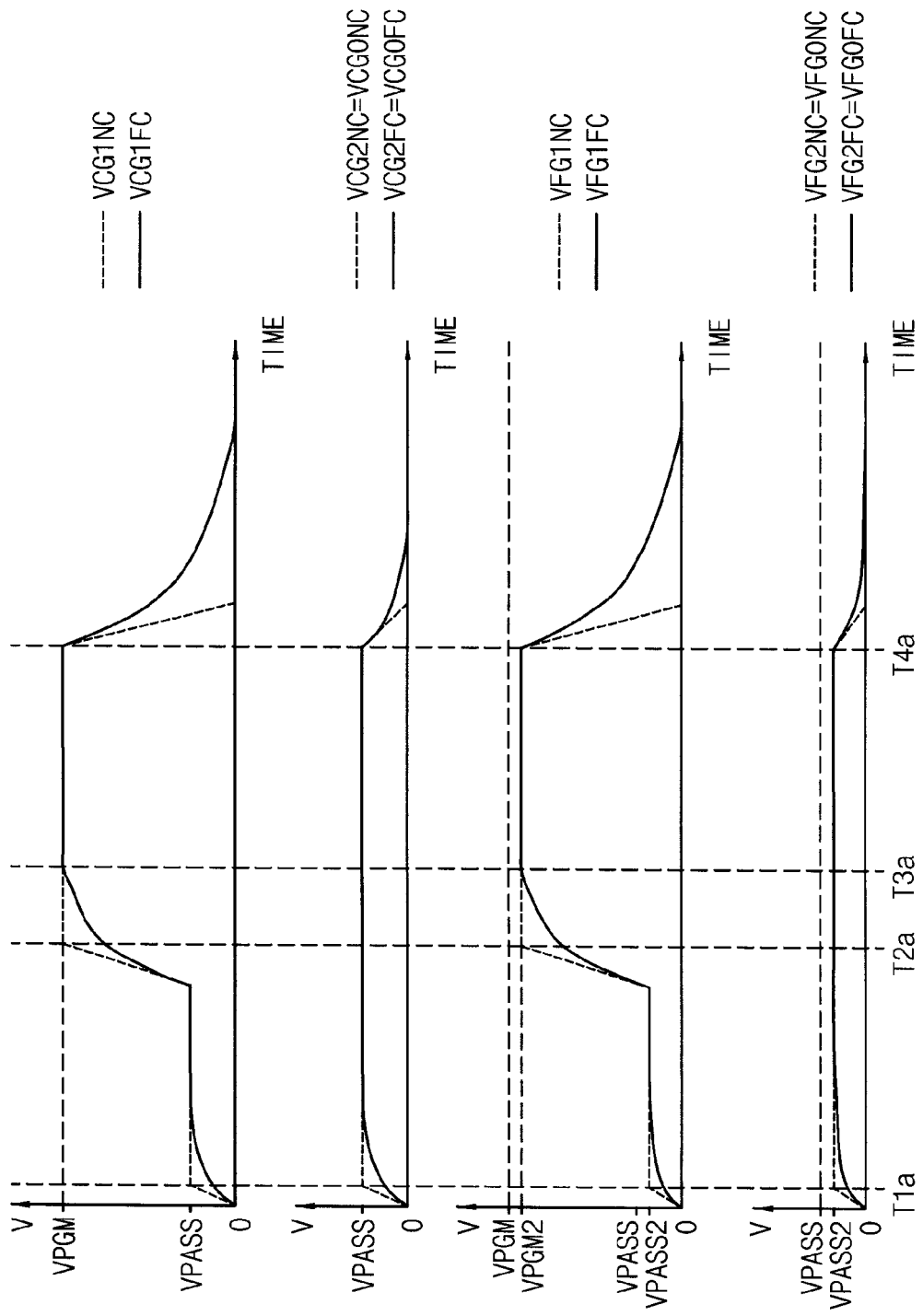
FIGS. 6 through 8 are timing diagrams illustrating operation of memory cells included in the FIGS. 4 through 5.

FIG. 6 is a timing diagram illustrating an operation of signals of the first column floating gate transistors MC10, MC11, and MC12 and the second column floating gate transistors MC20, MC21, and MC22 in the case that the program voltage is applied to the first word line WL1 and the pass voltage is applied to the second word line WL2 and the third word line WL0. At the first time point T1a, the pass voltage is applied to the first word line WL1. The voltage VCG1NC of the (1, 1) control gate CG11 has the pass voltage level VPASS at the first time point T1a without RC delay because the (1, 1) control gate CG11 is close to the address decoder 110. The voltage VCG1FC of the (2, 1) control gate CG21 has a voltage level which is lower than the pass voltage level VPASS at the first time point T1a because of RC delay caused by the long distance between the (2, 1) control gate CG21 and the address decoder 110.

At the first time point T1a, the pass voltage is applied to the second word line WL2 and the third word line WL0. The voltage VCG2NC of the (1, 2) control gate CG12 has the pass voltage level VPASS at the first time point T1a without RC delay because the (1, 2) control gate CG12 is close to the address decoder 110. The voltage VCG0NC of the (1, 3) control gate CG10 has the pass voltage level VPASS at the first time point T1a without RC delay because the (1, 3) control gate CG10 is close to the address decoder 110. The voltage VCG2FC of the (2, 2) control gate CG22 has a voltage level which is lower than the pass voltage level VPASS at the first time point T1a because of RC delay caused by the long distance between the (2, 2) control gate CG22 and the address decoder 110. The voltage VCG0FC of the (2, 3) control gate CG20 has a voltage level which is lower than the pass voltage level VPASS at the first time point T1a because of RC delay caused by the long distance between the (2, 3) control gate CG20 and the address decoder 110.

The voltage VFG1NC of the (1, 1) floating gate FG11 has a second pass voltage level VPASS2 which is lower than the pass voltage level VPASS at the first time point T1a because of the first through third parasitic capacitances C11, C12, and C13. The voltage VFG1FC of the (2, 1) floating gate FG21 has a voltage level which is lower than the second pass voltage level VPASS2 because of RC delay caused by the long distance between the (2, 1) floating gate FG21 and the address decoder 110.

The voltage VFG2NC of the (1, 2) floating gate FG12 and the voltage VFG0NC of the (1, 3) floating gate FG10 have the second pass voltage level VPASS2 at the first time point T1a. The voltage VFG2FC of the (2, 2) floating gate FG22 and the voltage VFG0FC of the (2, 3) floating gate FG20 have a voltage level which is lower than the second pass voltage level VPASS2.

At the second time point T2a, the program voltage is applied to the first word line WL1. The voltage VCG1NC of the (1, 1) control gate CG11 has the program voltage level VPGM at the second time point T2a without RC delay because the (1, 1) control gate CG11 is close to the address decoder 110. The voltage VCG1FC of the (2, 1) control gate CG21 has a voltage level which is lower than the program voltage level VPGM at the second time point T2a because of RC delay caused by the long distance between the (2, 1) control gate CG21 and the address decoder 110.

The voltage VFG1NC of the (1, 1) floating gate FG11 has a second program voltage level VPGM2 which is lower than the program voltage level VPGM at the second time point T2a because of the first through third parasitic capacitances C11, C12, and C13. The voltage VFG1FC of the (2, 1) floating gate FG21 has a voltage level which is lower than the second program voltage level VPGM2 because of RC delay caused by the long distance between the (2, 1) floating gate FG21 and the address decoder 110. The voltage VCG1FC of the (2, 1) control gate CG21 has the program voltage level VPGM at the third time point T3a. The voltage VFG1FC of the (2, 1) floating gate FG21 has the second program voltage level VPGM2 at the third time point T3a.

Charge is stored to the (1, 1) floating gate FG11 from the second time point T2a to the fourth time point T4a with a rate corresponding to the second program voltage level VPGM2. The threshold voltage of the (1, 1) floating gate transistor MC11 is determined based on the charge stored in the (1, 1) floating gate FG11. Charge is stored to the (2, 1) floating gate FG21 from the third time point T3a to the fourth time point T4a with a rate corresponding to the second program voltage level VPGM2. The threshold voltage of the (2, 1) floating gate transistor MC21 is determined based on the charge stored in the (2, 1) floating gate FG21. Because of the difference of charging time, the threshold voltage of the (1, 1) floating gate transistor MC11 is different from the threshold voltage of the (2, 1) floating gate transistor MC21.

Figure 7:
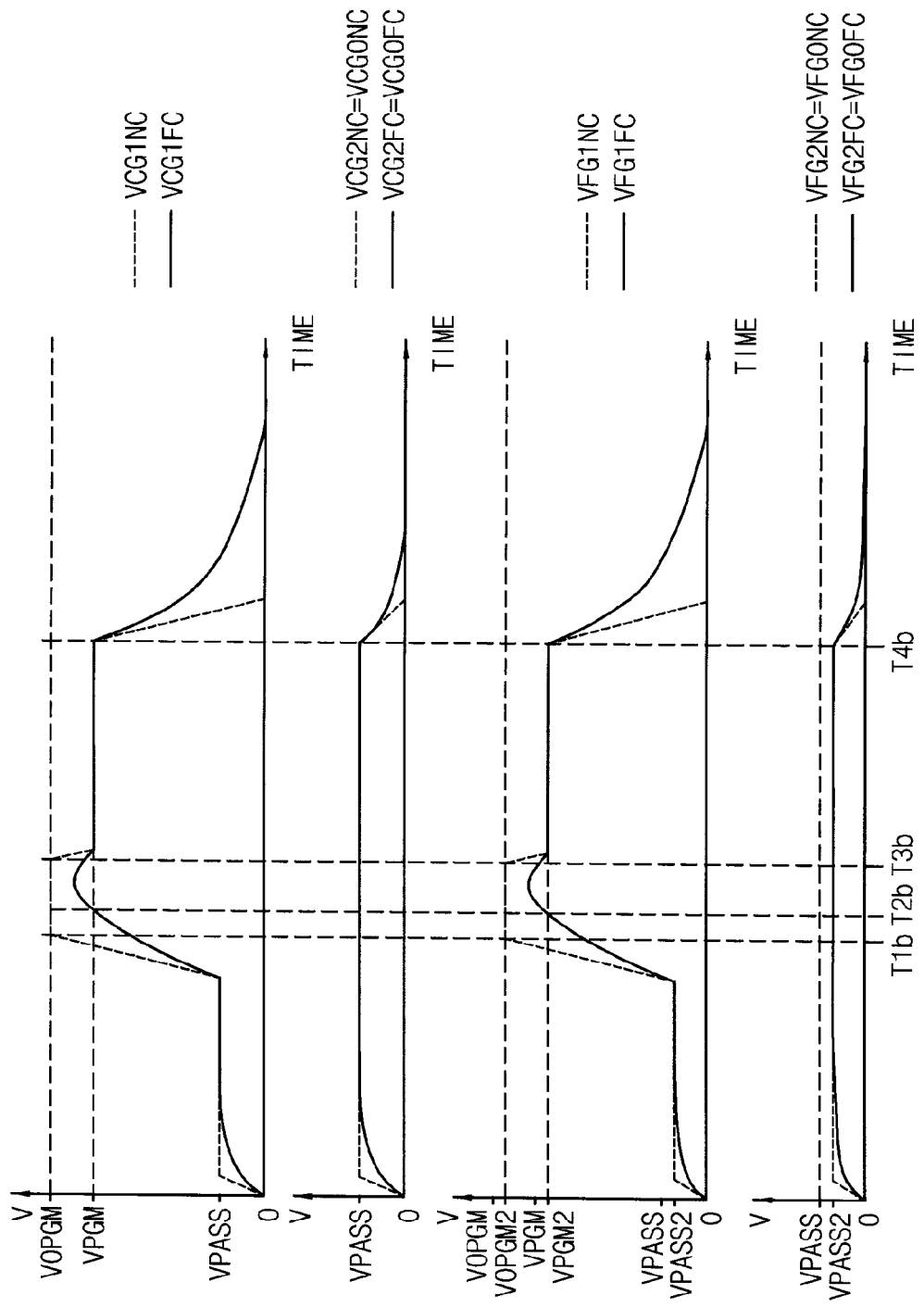

FIG. 7 is a timing diagram illustrating operation of signals of the first column floating gate transistors MC10, MC11, and MC12 and the second column floating gate transistors MC20, MC21, and MC22 in the case that the over program voltage is applied to the first word line WL1 during the over program period T1b~T3b, the program voltage is applied to the first word line WL1 during the normal program period T3b~T4b and the pass voltage is applied to the second word line WL2 and the third word line WL0. Operation of signals before the first time point T1b may be understood based on the reference to FIG. 6.

At the first time point T1b, the over program voltage is applied to the first word line WL1. The voltage VCG1NC of the (1, 1) control gate CG11 has the over program voltage level VOPGM which is higher than the program voltage level VPGM at the first time point T1b. The voltage VFG1NC of the (1, 1) floating gate FG11 has the second over program voltage level VOPGM2 which is lower than the over program voltage level VOPGM at the first time point T1b. The voltage VCG1FC of the (2, 1) control gate CG21 reaches to the program voltage level VPGM at the second time point T2b. The voltage VFG1FC of the (2, 1) floating gate FG21 reaches to the second program voltage level VPGM2 at the second time point T2b.

The first charge is stored to the (1, 1) floating gate FG11 from the first time point T1b to the third time point T3b with a rate corresponding to the second over program voltage level VOPGM2. The second charge is stored to the (1, 1) floating gate FG11 from the third time point T3b to the fourth time point T4b with a rate corresponding to the second program voltage level VPGM2. The threshold voltage of the (1, 1) floating gate transistor MC11 is determined based on the first and second charges stored in the (1, 1) floating gate FG11.

The first charge is stored to the (2, 1) floating gate FG21 from the second time point T2b to the third time point T3b with a rate corresponding to a voltage level which is slightly higher than the second program voltage level VPGM2. The second charge is stored to the (2, 1) floating gate FG21 from the third time point T3b to the fourth time point T4b with a rate corresponding to the second program voltage level VPGM2. The threshold voltage of the (2, 1) floating gate transistor MC21 is determined based on the first and second charges stored in the (2, 1) floating gate FG21.

Although difference between charging time T1b~T4b of the (1, 1) floating gate transistor MC11 and charging time T2b~T4b of the (2, 1) floating gate transistor MC21 is reduced compared to the FIG. 6, the difference between the threshold voltage of the (1, 1) floating gate transistor MC11 and the threshold voltage of the (2, 1) floating gate transistor MC21 is still huge because the charging rate is sensitive to a voltage of the floating gate.

Figure 8:
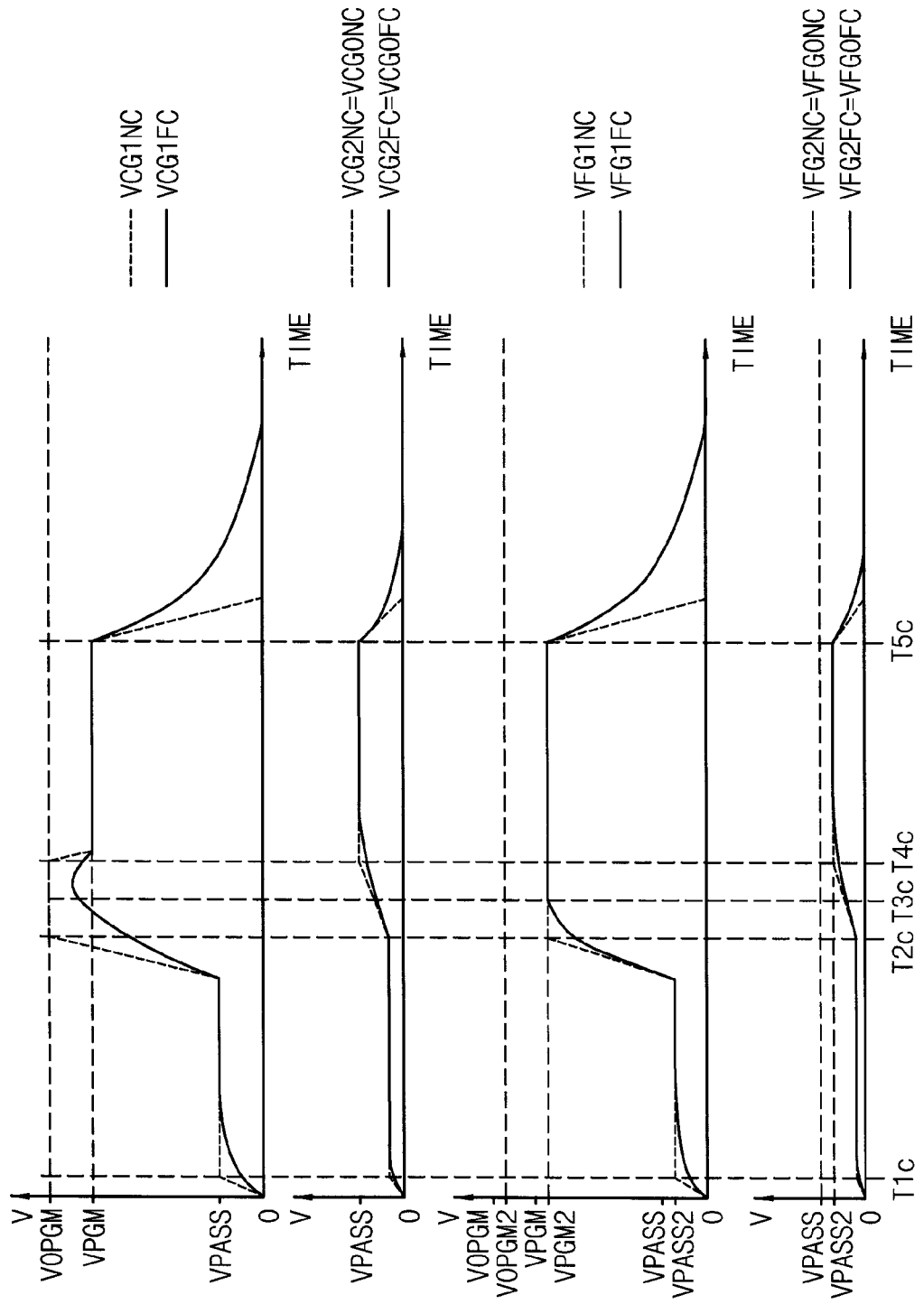

FIG. 8 is a timing diagram illustrating an operation of signals of the first column floating gate transistors MC10, MC11, and MC12 and the second column floating gate transistors MC20, MC21, and MC22 according to example embodiments in the case that the over program voltage is applied to the first word line WL1 and a voltage which is lower than the pass voltage to the second word line WL2 and the third word line WL0 during the over program period T2c~T4c, and the program voltage is applied to the first word line WL1 and the pass voltage is applied to the second word line WL2 and the third word line WL0 during the normal program period T4c~T5c.

At the first time point T1c, the pass voltage is applied to the first word line WL1, the second word line WL2, and the third word line WL0. The voltage VCG1NC of the (1, 1) control gate CG11 has the pass voltage level VPASS at the first time point T1c. The voltage VCG2NC of the (1, 2) control gate CG12 and the voltage VCG0NC of the (1, 3) control gate (CG10) have a voltage level which is lower than the pass voltage level VPASS at the first time point T1c. At the second time point T2c, the over program voltage is applied to the first word line WL1.

The voltage VCG1NC of the (1, 1) control gate CG11 has the over program voltage level VOPGM which is higher than the program voltage level VPGM during the over program period T2c~T4c. The voltage VCG2NC of the (1, 2) control gate CG12 and the voltage VCG0NC of the (1, 3) control gate CG10 have the voltage which is lower than the pass voltage level VPASS during the over program period T2c~T4c. At the third time point T3c, the voltage VCG1FC of the (2, 1) control gate CG21 reaches to the program voltage level VPGM.

In an example embodiment, the voltage VCG2NC of the (1, 2) control gate CG12 and the voltage VCG0NC of the (1, 3) control gate CG10 may increase continuously from the second time point T2c to the third time point T3c. In another example embodiment, the voltage VCG2NC of the (1, 2) control gate CG12 and the voltage VCG0NC of the (1, 3) control gate CG10 may increase in the shape of step pulse from the second time point T2c to the third time point T3c. In still another example embodiment, the voltage VCG2NC of the (1, 2) control gate CG12 and the voltage VCG0NC of the (1, 3) control gate CG10 may be fixed as a voltage level which is lower than the pass voltage level VPASS from the second time point T2c to the third time point T3c.

During the over program period T2c~T4c, although the voltage VCG1NC of the (1, 1) control gate CG11 has the over program voltage level VOPGM which is higher than the program voltage level VPGM, the voltage VFG1NC of the (1, 1) floating gate FG11 may not exceed the second program voltage level VPGM2 because the voltage VFG1NC of the (1, 1) floating gate FG11 is affected by the voltage VCG2NC of the (1, 2) control gate CG12 and the voltage VCG0NC of the (1, 3) control gate CG10, which have lower voltage level than the pass voltage level VPASS, through the first and third parasitic capacitances C11, C13.

During the over program period T2c~T4c, although the voltage VCG1FC of the (2, 1) control gate CG21 has a voltage level which is higher than the program voltage level VPGM, the voltage VFG1FC of the (2, 1) floating gate FG21 may not exceed the second program voltage level VPGM2 because the voltage VFG1FC of the (2, 1) floating gate FG21 is affected by the voltage VCG2FC of the (2, 2) control gate CG22 and the voltage VCG0FC of the (2, 3) control gate CG20, which have lower voltage level than the pass voltage level VPASS, through the first and third parasitic capacitances C21, C23.

Charge is stored to the (1, 1) floating gate FG11 from the second time point T2c to the fifth time point T5c with a rate corresponding to the second program voltage level VPGM2. The threshold voltage of the (1, 1) floating gate transistor MC11 is determined based on the charge stored in the (1, 1) floating gate FG11. Charge is stored to the (2, 1) floating gate FG21 from the third time point T3c to the fifth time point T5c with a rate corresponding to the second program voltage level VPGM2. The threshold voltage of the (2, 1) floating gate transistor MC21 is determined based on the charge stored in the (2, 1) floating gate FG21.

Because a difference between charging time T2c~T5c of the (1, 1) floating gate transistor MC11 and charging time T3c~T5c of the (2, 1) floating gate transistor MC21 is reduced compared to FIG. 6 and the voltage VFG1NC of the (1, 1) floating gate FG11 is equal to the voltage VFG1FC of the (2, 1) floating gate FG21 during the over program period T3c~T4c and the normal program period T4c~T5c, the difference between the threshold voltage of the (1, 1) floating gate transistor MC11 and the threshold voltage of the (2, 1) floating gate transistor MC21 may be reduced.

In an example embodiment, the pass voltage may be applied to the fourth word line WLN during the over program period T2c~T4c. In another example embodiment, a voltage, which is applied to the second word line WL2 and the third word line WL0, may be applied to the fourth word line WLN during the over program period T2c~T4c.

During the over program period T2c~T4c, each of the (1, 2) floating gate transistor MC12, the (1, 3) floating gate transistor MC13, the (1, 4) floating gate transistor MC1N, the (2, 2) floating gate transistor MC22, the (2, 3) floating gate transistor MC23, and the (2, 4) floating gate transistor MC2N may operate as a pass transistor.

Figure 9:
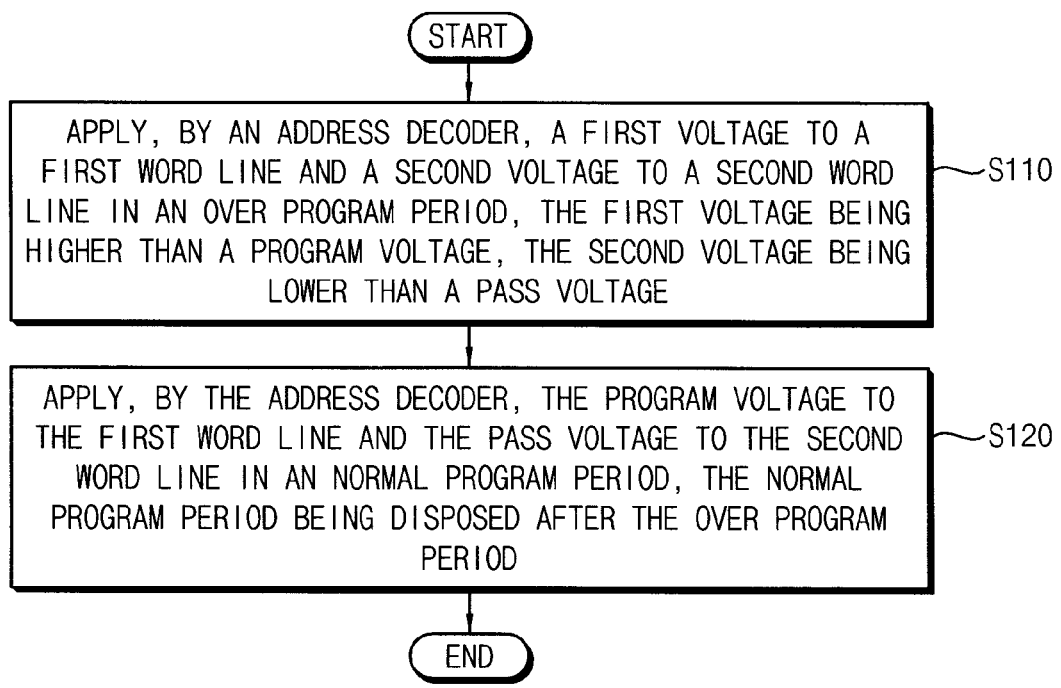
FIG. 9 is a flow chart illustrating a method of programming a non-volatile memory device according to an example embodiment.

FIG. 9 is a flow chart illustrating a method of programming a non-volatile memory device according to an example embodiment. Referring to FIG. 9, a non-volatile memory device includes a first word line, a second word line adjacent to the first word line, first memory cells connected to the first word line, second memory cells, which are connected to the second word line and are connected to the first memory cells respectively, and an address decoder. A method of programming the non-volatile memory device includes applying, by the address decoder, a first voltage to the first word line and a second voltage to the second word line in an over program period of the first memory cells (S110). The first voltage is higher than a program voltage of the first and second memory cells. The second voltage is lower than a pass voltage of the first and second memory cells.

The method further includes applying, by the address decoder, the program voltage to the first word line and the pass voltage to the second word line in a normal program period of the first memory cells (S120). The normal program period is performed after the over program period. Steps (S110 and S120) may be understood based on the references to FIGS. 1 through 8.

Figure 10:
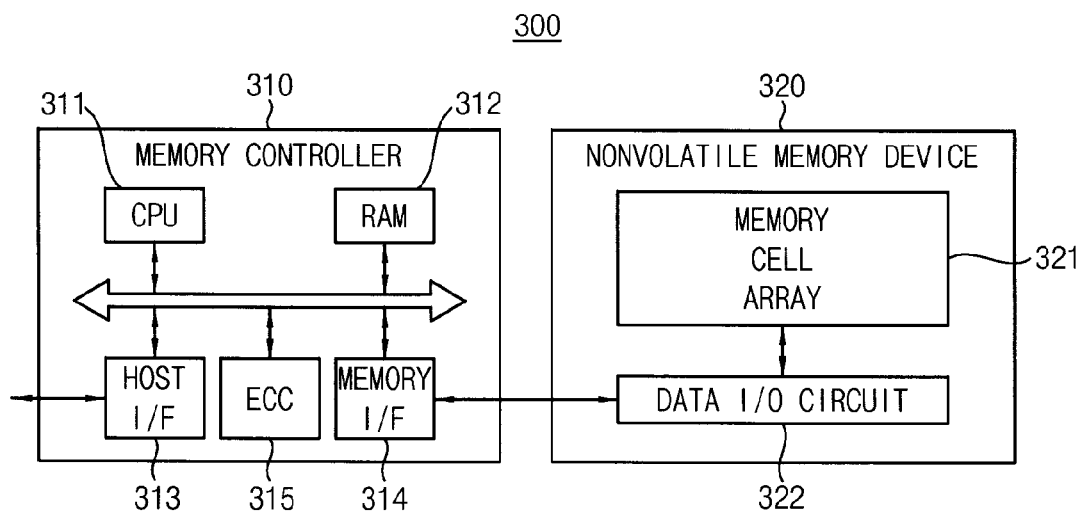
FIG. 10 is a block diagram illustrating a memory system according to an example embodiment.

FIG. 10 is a block diagram illustrating a memory system according to an example embodiment. Referring to FIG. 10, a memory system 300 includes a memory controller 310 and a nonvolatile memory device 320. The nonvolatile memory device 320 includes a memory cell array 321 and a data I/O circuit 322. The memory cell array 321 is formed on a substrate in a three-dimensional structure. For example, memory cells included in the memory cell array 321 may be formed in a direction perpendicular to the substrate. The memory cells included in the memory cell array 321 may be connected to a plurality of word lines, which are stacked in a direction perpendicular to the substrate, and a plurality of bit lines, which are formed in a direction parallel to the substrate.

The data I/O circuit 322 is connected to the memory cell array 321 through the plurality of bit lines. The data I/O circuit 322 may select at least one of the plurality of bit lines, output data read from a memory cell connected to the selected at least one bit line to the memory controller 310, and write data received from the memory controller 310 in a memory cell connected to the selected at least one bit line.

The non-volatile memory device 320 may reduce a difference between the program time of a near memory cell which is near the address decoder and program time of a far memory cell which is far from the address decoder and prevent over program of the near memory cell by applying a high voltage which is higher than program voltage to a first word line corresponding to address signal and applying a low voltage which is lower than pass voltage to a second word line which is adjacent to the first word line during program operation. After completing the program operation, the difference between a threshold voltage of the near memory cell and a threshold voltage of the far memory cell according to example embodiments may be lower than the difference between the threshold voltage of the near memory cell and the threshold voltage of the far memory cell according to conventional methods.

The nonvolatile memory device 320 may be implemented with the nonvolatile memory devices 100, 200 of FIGS. 1 and 2. A structure and an operation of the nonvolatile memory device 200 of FIG. 2 are described above with reference to FIGS. 1 to 8. Therefore, a detail description of the nonvolatile memory device 320 is omitted here.

The memory controller 310 may control the nonvolatile memory device 320. The memory controller 310 may control data transfer between an external host and the nonvolatile memory device 320. The memory controller 310 may include a central processing unit 311, a buffer memory 312, a host interface 313 and a memory interface 314.

The central processing unit 311 may perform operations for the data transfer. The buffer memory 312 may be implemented by a dynamic random access memory (DRAM), a static random access memory (SRAM), a phase change random access memory (PRAM), a ferroelectric random access memory (FRAM), a resistance random access memory (RRAM), a magnetic random access memory (MRAM), etc. The buffer memory 312 may be an operational memory of the central processing unit 911. In some example embodiments, the buffer memory 312 may be included in the memory controller 310. In other example embodiments, the buffer memory 312 may be outside of the memory controller 310.

The host interface 313 may be coupled to the host, and the memory interface 314 may be coupled to the nonvolatile memory device 320. The central processing unit 311 may communicate with the host via the host interface 313. For example, the host interface 313 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on. Further, the central processing unit 311 may communicate with the nonvolatile memory device 320 via the memory interface 314.

In some example embodiments, the memory controller 310 may further include an error correction block 315 for error correction. In some example embodiments, the memory controller 310 may be built in the nonvolatile memory device 320, or the memory controller 310 and the nonvolatile memory device 320 may be implemented as separate chips. The memory system 300 may be implemented as a memory card, a solid state drive, and so on.

Figure 11:
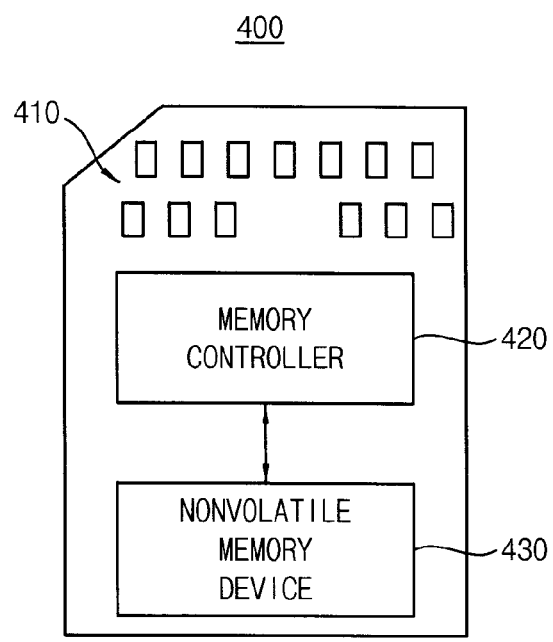
FIG. 11 is a block diagram illustrating a memory card according to an example embodiment.

FIG. 11 is a block diagram illustrating a memory card according to an example embodiment. Referring to FIG. 11, a memory card 400 includes a plurality of connecting pins 410, a memory controller 420 and a nonvolatile memory device 430. The connecting pins 410 may be coupled to an external host to transfer signals between the host and the memory card 400. The connecting pins 410 may include a clock pin, a command pin, a data pin and/or a reset pin. The memory controller 420 may receive data from the host, and may store the received data in the nonvolatile memory device 430.

The non-volatile memory device 430 may reduce the difference between a program time of a near memory cell which is near the address decoder and a program time of a far memory cell which is far from the address decoder and prevent over program of the near memory cell by applying a high voltage which is higher than the program voltage to a first word line corresponding to address signal and applying a low voltage which is lower than the pass voltage to a second word line which is adjacent to the first word line during program operation. After completing the program operation, the difference between a threshold voltage of the near memory cell and a threshold voltage of the far memory cell according to example embodiments may be lower than the difference between the threshold voltage of the near memory cell and the threshold voltage of the far memory cell according to conventional methods.

The nonvolatile memory device 430 may be implemented with the nonvolatile memory devices 100, 200 of FIGS. 1 and 2. A structure and an operation of the nonvolatile memory device 200 of FIG. 2 are described above with reference to FIGS. 1 to 8. Therefore, a detail description of the nonvolatile memory device 430 is omitted here.

The memory card 400 may include a MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, and so on.

In some example embodiments, the memory card 400 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, and so on.

Figure 12:
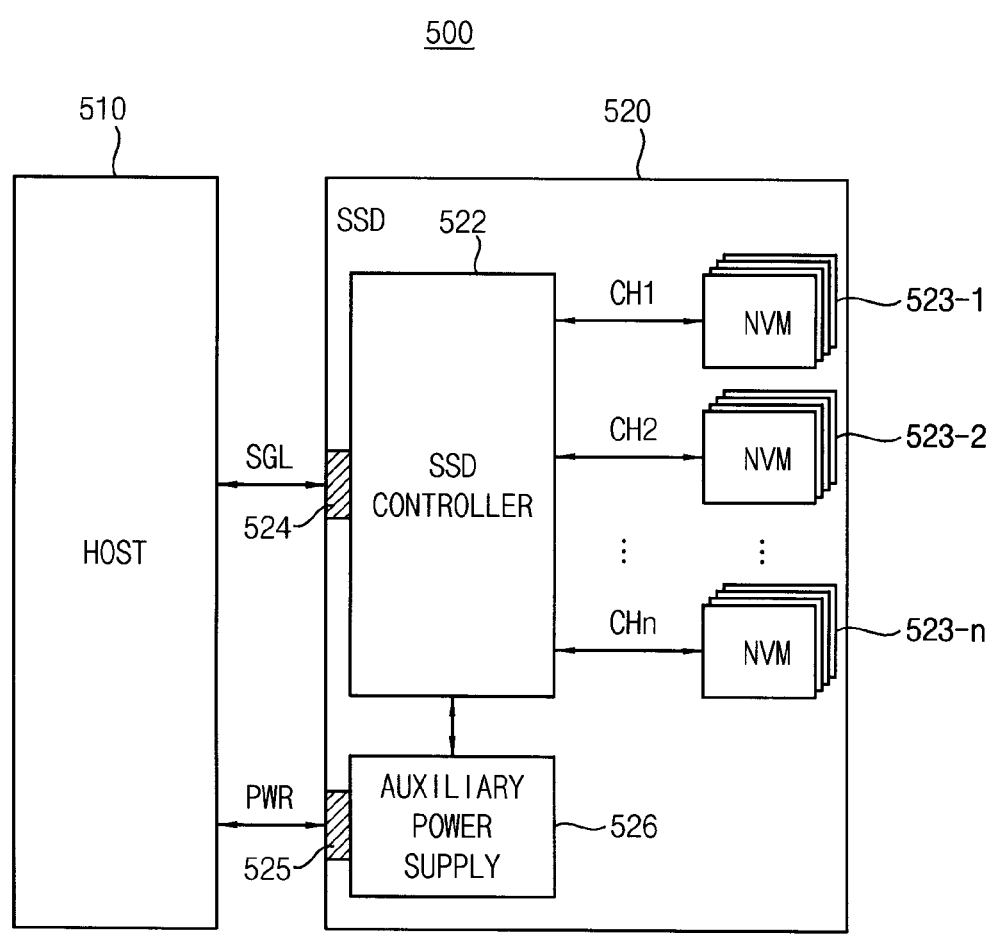
FIG. 12 is a block diagram illustrating a solid state drive system according to an example embodiment.

FIG. 12 is a block diagram illustrating a solid state drive system according to an example embodiment. Referring to FIG. 12, a SSD system 500 includes a host 510 and a SSD 520. The SSD 520 includes first through n-th nonvolatile memory devices 523-1, 523-2, . . . , 523-n and a SSD controller 522. Here, n represents an integer greater than or equal to two. The first through n-th nonvolatile memory devices 523-1, 523-2, . . . , 523-n may be used as a storage medium of the SSD 520.

Each of the first through n-th nonvolatile memory devices 523-1, 523-2, . . . , 523-n may reduce a difference between a program time of a near memory cell which is near the address decoder and a program time of a far memory cell which is far from the address decoder and prevent over program of the near memory cell by applying a high voltage which is higher than the program voltage to a first word line corresponding to an address signal and applying a low voltage which is lower than the pass voltage to a second word line which is adjacent to the first word line during the program operation. After completing the program operation, the difference between a threshold voltage of the near memory cell and a threshold voltage of the far memory cell according to example embodiments may be lower than the difference between the threshold voltage of the near memory cell and the threshold voltage of the far memory cell according to conventional methods.

Each of the first through n-th nonvolatile memory devices 523-1, 523-2, . . . , 523-n may be implemented with the nonvolatile memory devices 100, 200 of FIGS. 1 and 2. A structure and an operation of the nonvolatile memory device 200 of FIG. 2 are described above with reference to FIGS. 1 to 8. Therefore, a detailed description of the first through n-th nonvolatile memory devices 523-1, 523-2, . . . , 523-n is omitted here.

The SSD controller 522 is coupled to the first through n-th nonvolatile memory devices 523-1, 523-2, . . . , 523-n by first through n-th channels CH1, CH2, . . . , CHn, respectively. The SSD controller 522 may exchange a signal SGL with the host 510 through a signal connector 524. The signal SGL may include a command, an address and data. The SSD controller 522 may perform a program operation and a read operation on the first through n-th nonvolatile memory devices 523-1, 523-2, . . . , 523-n according to the command received from the host 510.

The SSD 520 may further include an auxiliary power supply 526. The auxiliary power supply 526 may receive power PWR from the host 510 through a power connector 525 and provide power to the SSD controller 522. The auxiliary power supply 526 may be placed inside or outside the SSD 520. For example, the auxiliary power supply 526 may be placed in a main board and provide auxiliary power to the SSD 520.

Figure 13:
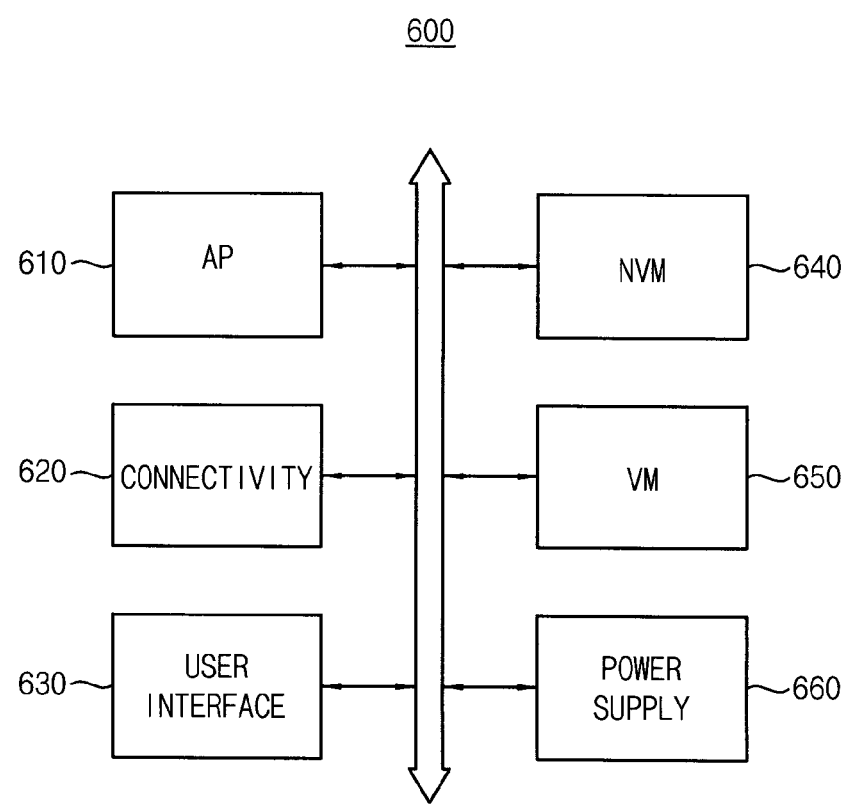
FIG. 13 is a block diagram illustrating a mobile system according to an example embodiment.

FIG. 13 is a block diagram illustrating a mobile system according to an example embodiment. Referring to FIG. 13, a mobile system 600 includes an application processor AP 610, a connectivity unit 620, a user interface 630, a nonvolatile memory device NVM 640, a volatile memory device VM 650 and a power supply 660. In some embodiments, the mobile system 600 may be a mobile phone, a smart phone, a personal digital assistant (PDA), a portable multimedia player (PMP), a digital camera, a music player, a portable game console, a navigation system, etc.

The application processor 610 may execute applications, such as a web browser, a game application, a video player, etc. In some example embodiments, the application processor 610 may include a single core or multiple cores. For example, the application processor 610 may be a multi-core processor, such as a dual-core processor, a quad-core processor, a hexa-core processor, etc. The application processor 610 may include an internal or external cache memory.

The connectivity unit 620 may perform wired or wireless communication with an external device. For example, the connectivity unit 620 may perform Ethernet communication, near field communication (NFC), radio frequency identification (RFID) communication, mobile telecommunication, memory card communication, universal serial bus (USB) communication, etc. In some embodiments, the connectivity unit 620 may include a baseband chipset that supports communications, such as global system for mobile communications (GSM), general packet radio service (GPRS), wideband code division multiple access (WCDMA), high speed downlink/uplink packet access (HSxPA), etc. The nonvolatile memory device 640 may store a boot image for booting the mobile system 600.

The non-volatile memory device 640 may reduce a difference between a program time of a near memory cell which is near the address decoder and a program time of a far memory cell which is far from the address decoder and prevent over program of the near memory cell by applying a high voltage which is higher than the program voltage to a first word line corresponding to an address signal and applying a low voltage which is lower than the pass voltage to a second word line which is adjacent to the first word line during the program operation. After completing the program operation, the difference between a threshold voltage of the near memory cell and a threshold voltage of the far memory cell according to example embodiments may be lower than the difference between the threshold voltage of the near memory cell and the threshold voltage of the far memory cell according to conventional methods.

The nonvolatile memory device 640 may be implemented with the nonvolatile memory devices 100, 200 of FIGS. 1 and 2. A structure and an operation of the nonvolatile memory device 200 of FIG. 2 are described above with reference to FIGS. 1 to 8. Therefore, a detailed description of the nonvolatile memory device 640 is omitted here.

The volatile memory device 650 may store data processed by the application processor 610, or may operate as a working memory. The user interface 630 may include at least one input device, such as a keypad, a touch screen, etc., and at least one output device, such as a speaker, a display device, etc. The power supply 660 may supply a power supply voltage to the mobile system 600. In some embodiments, the mobile system 600 may further include an image processor, and/or a storage device, such as a memory card, a solid state drive (SSD), a hard disk drive (HDD), a CD-ROM, etc.

In some embodiments, the mobile system 600 and/or components of the mobile system 600 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-volatile memory device comprising:
    a first word line;
    a second word line adjacent to the first word line;
    first memory cells connected to the first word line;
    second memory cells connected to the second word line and connected to the first memory cells, respectively; and
    an address decoder configured to apply a first voltage to the first word line and apply a second voltage to the second word line in an over program period of the first memory cells, the first voltage being higher than a program voltage of the first and second memory cells, the second voltage being lower than a pass voltage of the first and second memory cells.

2. The non-volatile memory device of claim 1, wherein the address decoder applies the program voltage to the first word line and applies the pass voltage to the second word line in a normal program period of the first memory cells; and wherein the normal program period is performed after the over program period.

3. The non-volatile memory device of claim 1 further including:
    a third word line which is not adjacent to the first word line; and
    third memory cells connected to the third word line.

4. The non-volatile memory device of claim 3, wherein the address decoder applies the second voltage to the third word line in the over program period.

5. The non-volatile memory device of claim 3, wherein the address decoder applies the pass voltage to the third word line in the over program period.

6. The non-volatile memory device of claim 1, wherein a memory cell of the first memory cells includes a first floating gate transistor having a first floating gate and a first control gate connected to the first word line; wherein a memory cell of the second memory cells includes a second floating gate transistor having a second floating gate and a second control gate connected to the second word line; and wherein the memory cell of the first memory cells is connected to the memory cell of the second memory cells.

7. The non-volatile memory device of claim 6, wherein a voltage difference between the first floating gate and a substrate is generated based on a voltage of the first control gate and a voltage of the second control gate.

8. The non-volatile memory device of claim 6, wherein the second floating gate transistor operates as a pass transistor in the over program period.

9. The non-volatile memory device of claim 6, wherein the first floating gate transistor stores charge corresponding to a voltage difference between the first floating gate and a substrate to the first floating gate in the over program period.

10. The non-volatile memory device of claim 6, wherein a voltage difference between the first floating gate and a substrate in the over program period is equal to or lower than a voltage difference between the first floating gate and the substrate when the program voltage is applied to the first word line and the pass voltage is applied to the second word line.

11. The non-volatile memory device of claim 6, wherein a source of the first floating gate transistor is connected to a drain of the second floating gate transistor.

12. The non-volatile memory device of claim 6, wherein a drain of the first floating gate transistor is connected to a source of the second floating gate transistor.

13. The non-volatile memory device of claim 1, wherein the first memory cells include:
    a near floating gate transistor having a first floating gate and a first control gate connected to the first word line, the near floating gate transistor disposed within a first distance from the address decoder; and
    a far floating gate transistor having a second floating gate and a second control gate connected to the first word line, the far floating gate transistor disposed outside the first distance from the address decoder.

14. The non-volatile memory device of claim 13, wherein a voltage difference between the first floating gate and a substrate in the over program period is equal to or lower than a voltage difference between the first floating gate and the substrate when the program voltage is applied to the first word line and the pass voltage is applied to the second word line.

15. The non-volatile memory device of claim 13, wherein a voltage difference between the second floating gate and a substrate in the over program period is equal to or lower than a voltage difference between the first floating gate and the substrate when the program voltage is applied to the first word line and the pass voltage is applied to the second word line.

16. The non-volatile memory device of claim 1, further comprising:
    a control circuit configured to generate a row address signal and a column address signal based on a command signal and an address signal.

17. The non-volatile memory device of claim 16, further comprising:
    a voltage generating circuit configured to generate the program voltage, the pass voltage, the first voltage, and the second voltage; and
    a data input/output circuit connected to the first and second memory cells through a plurality of bit lines in response to the column address signal.

18. The non-volatile memory device of claim 16, wherein the address decoder operates in response to the row address signal; and wherein the first word line corresponds to the row address signal.

19. A non-volatile memory device comprising:
- a first word line;
- a second word line adjacent to the first word line;
- first memory cells connected to the first word line;
- second memory cells connected to the second word line and connected to the first memory cells, respectively;
- a control circuit configured to generate a row address signal and a column address signal based on a command signal and an address signal;
- a data input/output circuit connected to the first and second memory cells through a plurality of bit lines in response to the column address signal;
- a voltage generating circuit configured to generate a program voltage of the first and second memory cells, a pass voltage of the first and second memory cells, a first voltage, and a second voltage, the first voltage being higher than the program voltage, the second voltage being lower than the pass voltage; and
- an address decoder configured to apply the first voltage to the first word line corresponding to the row address signal and apply the second voltage to the second word line in an over program period of the first memory cells.

20. A method of programming a non-volatile memory device which includes a first word line, a second word line adjacent to the first word line, first memory cells connected to the first word line, second memory cells connected to the second word line and connected to the first memory cells respectively, and an address decoder, the method comprising:
- applying, by the address decoder, a first voltage to the first word line and a second voltage to the second word line in an over program period of the first memory cells, the first voltage being higher than a program voltage of the first and second memory cells, the second voltage being lower than a pass voltage of the first and second memory cells; and
- applying, by the address decoder, the program voltage to the first word line and the pass voltage to the second word line in a normal program period of the first memory cells, the normal program period being performed after the over program period.

* * * * *